United States Patent [19]

Matsushita et al.

[11] Patent Number: 4,517,584
[45] Date of Patent: May 14, 1985

[54] CERAMIC PACKAGED SEMICONDUCTOR DEVICE

[75] Inventors: Yasuo Matsushita; Kousuke Nakamura; Mitsuru Ura, all of Hitachi, Japan

[73] Assignee: Hitachi, Ltd., Tokyo, Japan

[21] Appl. No.: 448,592

[22] Filed: Dec. 10, 1982

[30] Foreign Application Priority Data

Dec. 11, 1981 [JP] Japan .................. 56-200644

[51] Int. Cl.³ .............. H01L 23/34; H01L 23/36; H01L 23/14
[52] U.S. Cl. .................. 357/80; 357/67; 357/81; 357/74; 357/73
[58] Field of Search .......... 357/73, 74, 80, 81, 357/67, 72

[56] References Cited

U.S. PATENT DOCUMENTS

| 3,408,228 | 10/1968 | Cox | 357/74 X |
|---|---|---|---|
| 3,576,668 | 4/1971 | Fenster et al. | 357/73 X |
| 3,650,778 | 3/1972 | Dumesnil et al. | 357/80 X |
| 3,718,608 | 2/1973 | Mason et al. | 357/73 X |
| 3,825,442 | 7/1974 | Moore | 357/73 X |
| 3,900,330 | 8/1975 | Moriguchi et al. | 357/73 X |
| 4,073,657 | 2/1978 | Davis et al. | 357/73 X |
| 4,172,109 | 10/1979 | Smoak | 264/65 |
| 4,352,120 | 9/1982 | Kurihara et al. | 357/81 |
| 4,396,935 | 8/1973 | Schuck | 357/80 X |

FOREIGN PATENT DOCUMENTS

| 28802 | 5/1981 | European Pat. Off. | |
| 15047 | 2/1981 | Japan | 357/80 |

Primary Examiner—Andrew J. James
Assistant Examiner—Sheila V. Clark
Attorney, Agent, or Firm—Antonelli, Terry & Wands

[57] ABSTRACT

A semiconductor device with a semiconductor element encased in a hollow ceramic package. The portion of the package at which the semiconductor element is disposed is formed from a SiC-based substrate containing Be or a compound of Be with a thin $SiO_2$ layer being capable of reacting with glass provided thereon and with a glass layer or a thin film circuit on the $SiO_2$ layer.

23 Claims, 7 Drawing Figures

CERAMIC PACKAGED SEMICONDUCTOR DEVICE

BACKGROUND OF THE INVENTION

The present invention relates to a ceramic packaged semiconductor device with a semiconductor element contained in a hollow package of ceramic, and more particularly to a ceramic packaged semiconductor device with a ceramic substrate containing SiC as the main component and having a good adhesion to a conductor paste or a soldering glass.

Semiconductor devices with a semiconductor element such as IC, LSI, etc. contained in a package of ceramic material having an inside space and with lead conductors introduced into the package, the semiconductor element and lead conductors being connected with one another by bonding wires in the inside space of the package, are widely used, as are resin-sealed semiconductor devices. The problem of package type semiconductor device is a poor heat dissipation due to the use of the package. Obviously, the poor heat dissipation is a great obstacle to an attempt to make a semiconductor device with a larger capacity, a higher intergration density and a smaller size. Thus, a material with a low heat resistance is required for an insulating substrate of a semiconductor element in a ceramic package. Besides, a material for the insulating substrate must satisfy (1) a higher electrical insulation, (2) a substantially equal coefficient of thermal expansion to that of silicon, and (3) a higher mechanical strength. Sintered alumina is now used for the insulating substrate which can meet these requirements to some extent. From the standpoint of the thermal resistance, sintered alumina having a low thermal conductivity, such as 0.05 cal/sec.cm.°C., is not regarded as a preferable material for the insulating substrate for the semiconductor device, when attempting to make the integration density higher and the capacity larger.

As an approach for improving the heat dissipation characteristic of the ceramic packaged semiconductor device, a structure is proposed, in which a semiconductor element is mounted on the top of a stud of copper which extends through an insulating substrate to the exterior of a ceramic package, and a supporting plate of molybdenum is interposed between the semiconductor element and the copper stud to serve for mitigating thermal stress which may be produced due to difference in the coefficient of thermal expansion between the semiconductor element and the stud, and further a cooling fin is mounted on and around the copper stud. With this structure, all the heat conducting paths extending from the semiconductor element to the cooling fin are provided by metals having a high thermal conductivity, whereby a semiconductor device having an improved heat dissipation characteristic due to the reduced overall thermal resistance can be obtained. However, a semiconductor device suffers disadvantages in that an increased number of manufacturing steps are required due to a complicated structure requiring an increased number of components, the weight of the semiconductor device is increased due to the use of heavy components such as those of molybdenum and others, and a troublesome procedure is required for mounting a printed circuit or the like onto the device.

A SiC-based ceramic substrate having a high thermal conductivity and a high electric insulation as disclosed in Japanese Kokai (laid-open) Patent Application No. 66086/81, is light in weight and high in strength, as compared with the now widely used oxide ceramic substrate such as an alumina-based ceramic substrate, and the coefficient of thermal expansion of such SiC-based ceramic substrate is about one-half of that of the alumina substrate, and approximates that of silicon semiconductor elements. Particularly, the thermal conductivity is substantially equal to that of Al, and thus the SiC-based ceramic substrate has a good heat dissipation characteristic and is suitable as a substrate for semiconductor devices with silicon semiconductor elements.

To solder silicon semiconductor elements or form a conductor circuit on the SiC-based substrates for semiconductor devices, the SiC-based substrates are usually metallized with commercially available conductor pastes of a mixture of glass and metal such as Au, Ag, Cu, etc. In the case of substrates for packaged devices, bonding of a lead frame to a substrate with a solder glass, and sealing of an alumina ceramic cap to a substrate with a solder glass are used in addition to the metallizing.

However, the SiC-based ceramic substrate is generally poor in wettability with a molten metal or a molten glass, and thus has a problem that metallizing with a conductor paste with a high bonding strength to a substrate or bonding with a solder glass can be hardly obtained.

In the meantime, a thick film circuit is provided on an oxide-based ceramic substrate, such as alumina-based ceramic substrate, with a thick film paste by baking, for example, by applying a conductor paste to the substrate by printing and baking the paste, thereby forming at least one of the conductors or resistors from a mixture of a desired metal including a metal compound and glass, and further applying a glass paste onto the conductor or resistor by printing, and backing the paste, thereby overcoating the conductor or resistor. However, a thick film circuit having a high bonding strength has not been formed yet for a SiC-based ceramic substrate. For example, a high bonding strength cannot be obtained even by direct baking of the paste on a SiC-based ceramic substrate containing BeO as a sintering aid [Japanese Kokai (Laid-open) Patent Application No. 66086/81].

SUMMARY OF THE INVENTION

An object of the present invention is to provide an improved ceramic-packaged semiconductor device which is free from the drawbacks of the prior art device described above, and which has highly improved heat dissipation characteristics.

Another object of the present invention is to provide a ceramic-packaged electrical device with an insulating substrate having a circuit with a high bonding strength, particularly, a thick film circuit having a bonding strength equal to a tensile strength of a solder glass (about 2 kg/mm$^2$) and capable of being baked at a relatively low temperature.

In view of the above object, it is proposed according to a first aspect of the present invention that an insulating substrate for mounting thereon a semiconductor element to be hermetically housed within a ceramic package made from non-oxide ceramic which contains a non-oxide material as the main component and exhibits a coefficient of thermal expansion of $4 \times 10^{-6}$/°C. or less (which approximates that of silicon) and a thermal conductivity of not smaller than 0.2 ca/sec. cm.°C. at room temperature. With the term "non-oxide ceramic as the main component", it is intended to mean SiC admixed with a small amount of Be or a compound thereof, Si$_3$N$_4$ admixed with a small amount of Be or a compound thereof, or AlN admixed with a small amount of Be or a compound thereof. The term "coefficient of thermal expansion approximating to that of silicon" is to mean a coefficient of thermal expansion of the insulating substrate being approximate that of silicon semiconductor element to such a degree that when a silicon semiconductor element is bonded to the insulating substrate through an interposed bonding layer, neither destruction nor peeling occurs under a thermal stress due to a difference in the coefficient of thermal expansion between the silicon semiconductor element and the insulating substrate. Further, the thermal conductivity of not smaller than 0.2 cal/sec.cm.°C. at room temperature means the lower limit to the range of thermal conductivity of sintered non-oxide ceramic which can be obtained with a good reproducibility without any adverse effect on the insulating property of higher than $10^7$ Ω.cm and the coefficient of thermal expansion.

The insulating substrate for use in the semiconductor device of the present invention is preferably made from sintered SiC containing 0.05 to 5% by weight of at least one of Be and a compound of Be in terms of Be element on the basis of total ceramic and having a relative density of not smaller than 90% to the theoretical density, where the insulating substrate having a high thermal conductivity of 0.4 cal/sec.cm.°C. or more can be obtained with a good reproducibility.

A second aspect of the present invention is to use a substrate comprising the non-oxide ceramic substrate as a base, a thin layer capable of reacting with glass being provided on the base and a glass layer being further provided on the thin layer. These layers improve a wettability with a conductor paste or a solder glass, and metallizing and glass bonding with a high bonding strength can be obtained. The thin layer capable of reacting with glass is preferably an oxide layer or an oxidized layer. In the case of a SiC-based ceramic substrate or a Si$_3$N$_4$-based substrate as a base, a SiO$_2$ film formed by an oxidation treatment of the substrate is preferable. In the case of an AlN-based ceramic substrate, an Al$_2$O$_3$ film formed by an oxidation treatment of the substrate is preferable.

A third aspect of the present invention is to use a substrate comprising the non-oxide ceramic substrate as a base, the thin layer capable of reacting with glass being provided on the base as a first film, and a circuit comprising a conductor mixture of glass and a conductive material provided on the first film by bonding through reaction with the first film as a second film.

The present invention will be described in detail below, referring to the accompanying drawings.

DESCRIPTION OF THE PREFERRED EMBODIMENTS

Figure 1:
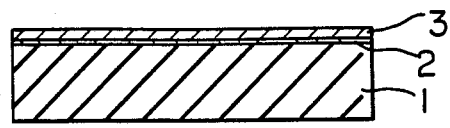
FIG. 1 is a schematic cross-sectional view showing one embodiment of a substrate for a semiconductor device according to the second aspect of the present invention.

The invention will be described in detail, referring to the following embodiments.

A semiconductor device according to a first embodiment of the present invention comprises an insulating substrate formed of SiC ceramic, a semiconductor element such as IC, LSI, etc. soldered to one surface of the insulating substrate substantially at a center portion thereof by means of an interposed metal paste, a lead member, for example, lead frame, with its one end being bonded to one side of the insulating substrate by a sealing glass and with the other end portion extending outwardly from the outer peripheral portion of the one side of the insulating substrate, bonding wires, each serving to electrically connect the lead member to the semiconductor element, and a cap member of alumina which is bonded hermetically to the one side of the insulating substrate and the lead member by a solder glass to form a hermetically sealed package in cooperation with the insulating substrate, thereby encapsulating therein the semiconductor element, the one end portions of the lead member and the bonding wires. The SiC ceramic constituting the insulating substrate of the semiconductor device according to the first embodiment is formed of a sintered ceramic which contains 2% by weight of BeO in terms of Be element on the basis of total ceramic, the balance being SiC and incidental impurities, and which exhibits a relative density of 98% to the theoretical density. This SiC ceramic characteristically exhibits specific gravity of about 3.2, resistivity of $10^{13}$ Ω.cm at room temperature, coefficient of thermal expansion of $4.0 \times 10^{-6}$/°C. in a range from room temperature to 900° C., thermal conductivity of 0.6 cal/sec.cm.°C. at room temperature, and bending strength of about 45 kg/mm$^2$ at room temperature.

Both sealing glass and solder glass contain 60 to 75% by weight of PbO, 5 to 20% by weight of ZnO, and 5 to 20% by weight of B$_2$O$_3$, or further contain not more than 15% by weight of SiO$_2$ and not more than 5% by weight of Al$_2$O$_3$ and have a coefficient of thermal expansion of $5-10 \times 10^{-6}$/°C. at room temperature.

Examples of sealing and solder glass composition are given below in % by weight:

| No. | PbO | ZnO | B$_2$O$_3$ | SiO$_2$ | Al$_2$O$_3$ | Coefficient of thermal expansion (room temp.) |
|---|---|---|---|---|---|---|
| 1 | 72.5 | 15.0 | 12.5 | — | — | $9.2 \times 10^{-6}$/°C. |
| 2 | 65 | 7 | 10 | 11 | — | $8.3 \times 10^{-6}$/°C. |
| 3 | 72 | 5 | 18 | 2.5 | 2.5 | — |

The lead member is made of ferni alloy or fernico alloy.

Examination as to characteristics of the semiconductor device having the structure as described above reveals that the dielectric strength between the insulating substrate and the lead member is higher than 1000 V and the thermal resistance between the semiconductor element and the insulating substrate of SiC ceramic is about 12.5°C./W. Further, neither deterioration such as damage, destruction or the like nor abnormality in the electric characteristics has been found in the semiconductor device even when subjected to an impact of about 50 G. These undesirable phenomena have not been observed even after the semiconductor device is subjected to 1000 thermal cycles of cooling and heating in the temperature range of −30° C. to +150° C.

The high dielectric strength attained in the semiconductor device mentioned above is due to such an arrangement that the semiconductor element is mounted on the insulating substrate made of SiC ceramic having a high insulation resistance. Further, the thermal resistance of a smaller value as compared with 21.9 W/°C. of the hitherto known semiconductor device with an insulating substrate of alumina ceramic (in reality, the thermal resistance is decreased by about 40% according to the invention) is due to the fact that the thermal conductivity of the SiC ceramic is about ten times as high as that of alumina. The increased shock or impact resistance as well as the enhanced resistance to the temperature changes, involving substantially no deterioration such as damage, etc., is due to the high mechanical strength of the SiC ceramic. Further, the fact that no abnormality occurs in the electric characteristics of the semiconductor device after the aforementioned thermal cycles is explained by the fact that the coefficient of thermal expansion of Si as the matrix of the semiconductor element and that of the SiC ceramic of the insulating substrate approximate to each other, producing no stress at the bonding parts, and thus the semiconductor is positively protected from deformation, damages and other abnormalities.

The most important advantage of the semiconductor device having the structure as described above resides in that the thermal resistance is remarkably decreased. Another advantage is that no thermal stress absorber, usually made of a heavy metal such as Mo, W or the like, is necessary to be interposed between the semiconductor and the insulating substrate due to the substantially equal coefficients of thermal expansion therebetween. Thus the semiconductor device according to the first embodiment of the present invention can realize weight reduction by about 15% or more, as compared with the semiconductor of the equivalent size using the insulating substrate of alumina ceramic. Moreover, significant reduction in the number of the required parts or components and the processing steps is a further advantage.

In preparation of SiC ceramic for forming the insulating substrate, beryllium oxide (BeO) as a sintering aid and silicon carbide (SiC) are pulverized to an average particle size of 10 $\mu$m or less, preferably, 2 $\mu$m or less. The pulverized mixture thus obtained is subjected to a hot press and sintered to form the insulating substrate of SiC ceramic. Contamination of aluminum and boron must be avoided, but low content of these two elements, for example, 0.1% by weight or less each, has no problem. However, when the content of aluminum is higher than 0.1% by weight, the electric resistivity of the sintered material will undesirably become smaller than $10^7$ $\Omega$.cm. On the other hand, when the content of boron is higher than 0.1% by weight, the thermal conductivity becomes smaller than 0.4 cal/sec.cm.°C.

A semiconductor device having a thermal conductivity of not lower than 0.5 cal/sec.cm.°C. can be obtained by sintering silicon carbide powder containing $\alpha$-form SiC as the main component.

Also important is the conditions used for sintering silicon carbide powder containing beryllium oxide. The sintering must be effected in the non-oxidizing atmosphere. Otherwise, surfaces of silicon carbide powder will be oxidized, failing to obtain the sintered material of high relative density. Further, no furnace material applicable to the oxidizing atmosphere at the sintering temperature of about 2000° C. is available for the present.

The sintering must be effected at a temperature of 1850° C. to 2500° C., preferably 1900° C. to 2300° C. At a sintering temperature lower than 1850° C., the sintered material will have a low relative density. On the other hand, sintering at a temperature higher than 2500° C. will promote vigorous sublimation of silicon carbide, failing to produce a dense ceramic due to excessive sintering. When the powder is pressed at a high sintering temperature according to the hot-press process, the upper limit of applicable load depends on the material of the hot-press die used. The ordinary die is made of graphite, where it is possible to apply a load of up to about 700 kg/cm$^2$.

In general, however, the sintered material of high relative density can be obtained without applying such high load. The load of 100 to 300 kg/cm$^2$ will be usually satisfactory. Silicon carbide powder having particle sizes on the submicron order can be formed into a sintered material of high relative density, for example, 90% or more to the theoretical density without applying such a high load. The optimal sintering time depends on the particle size of raw material powder, sintering temperature and load applied during sintering. It can be generally said that the smaller the particle size of raw material powder is, the higher the sintering temperature is, and that the higher the applicable load during sintering is, the shorter the time required for obtaining the sintered product of high relative density is.

In this conjunction, description will be made below with reference to an example.

SiC powder having an average particle size of 2 $\mu$m is mixed with 0.1 to 20% by weight of BeO powder having an average particle size of not smaller than 10 $\mu$m. The mixture thus obtained is pressed under a load of 1000 kg/cm$^2$ at room temperature to prepare a molding having a density of 1.60 to 1.67 g/cm$^3$ (which corresponds to a relative density of 50 to 52% to the theoretical density of SiC). Subsequently, the molding is placed in a die made of graphite and sintered according to the hot-press process under vacuum of $1 \times 10^{-5}$ to $1 \times 10^{-3}$ Torr and a load of 300 kg/cm$^2$, while heating it from room temperature to 2000° C. over about two hours, maintaining it at 2000° C. for an hour, and then leaving it to cool by turning off the heating power source. The load is released after it has been cooled below 1500° C. Thus, sintered material having a high density (relative density of not smaller than 90% to the theoretical density), a high thermal conductivity (0.4 cal/sec.cm.°C. or higher), a high electric resistivity ($10^{10}$ $\Omega$.cm or higher), and a low coefficient of thermal expansion ($4 \times 10^{-6}$/°C. or less) can be obtained.

The same conditions as described above are also applicable to $Si_3N_4$ and AlN, though the thermal conductivity is a litter lowered, for example, 0.2 cal/sec.cm.°C. However, the thermal conductivity is nevertheless significantly higher than that of alumina. Thus, there is no practical problem.

A semiconductor device according to a second embodiment of the invention has a cooling fin provided on the other side of insulating substrate by bonding. The cooling fin is preferably made of a metal such as aluminium, and is bonded with an epoxy or polyimide resin, a solder metal or a solder glass. An alloy containing manganese such as Cu-Mn, Ni-Mn or the like may be advantageously used as a solder metal having a higher bonding strength and a shorter bonding time when thermally bonded under pressure.

The semiconductor device of the structure according to the second embodiment as described above has a high dielectric strength as well as increased resistances to thermal fatigue and shocks, as is the case of the device of the first embodiment. It is found that the thermal resistance between the semiconductor element and the cooling fin is on the order of 9.3° C./W, which is obviously lower by about 25% than the corresponding thermal resistance of the semiconductor device of the first embodiment without the cooling fin, i.e. 12.5° C./W. Such reduction in the thermal resistance is due to the provision of the cooling fin. When compared with the thermal resistance of about 11.5° C./W as in the conventional semiconductor having the same structure as that of the first embodiment only except that the insulating substrate is formed of alumina ceramic, the thermal resistance of the semiconductor device is decreased by about 20%, which results from the fact that the insulating substrate of SiC ceramics has a much improved thermal conductivity than the substrate of alumina ceramic.

A semiconductor device according to a third embodiment of the invention has the insulating substrate integrated with a cooling fin, formed of the same SiC ceramic.

It has been found that the semiconductor device of the third embodiment has the dielectric strength and the resistances to thermal fatigue and shock comparable to those of the device of the first embodiment. Further, the device of the third embodiment has a thermal resistance of about 5.1° C./W, reduction by about 45% in the thermal resistances as compared with the device of the second embodiment in which the separately fabricated cooling fin is bonded to the insulating substrate by a binder resin. Such remarkable reduction in the thermal resistance is due to the fact that the insulating substrate and the cooling fin are integrally formed from SiC ceramic having a thermal conductivity comparable to that of aluminum and to elimination of the binder resin layer having a poor thermal conductivity, for example, an epoxy resin layer.

Moreover, in addition to the advantage of the semiconductor device of the third embodiment, i.e. reduction in the thermal resistance by about 45% as compared with the hitherto known device using an alumina insulating substrate and semiconductor elements provided on a copper stud through a Mo spacer, the overall weight of the device can be decreased by about 50% because of elimination of heavy metals such as Cu and Mo. Besides, the structure is more simple and economically more advantageous, because of the reduced number of components and the reduced number of manufacturing steps.

As described above, the semiconductor device of the third embodiment is distinguished not only in a better heat dissipation characteristic but also in more simple structure, lighter weight, and lower cost, while maintaining other desired characteristics.

Although the cooling fin is formed from electrically insulating SiC dense ceramic in the case of the third embodiment, the cooling fin may be also formed from porous electrically conductive material, only so far as the fin is concerned. In that case, it has been found that the heat resistance comparable to that of the third embodiment can be attained.

The semiconductor device can have no lead member extending from the interior to the exterior of the packaged device, where a metal lead layer is formed along the inner surface of insulating substrate, and bonding wires are connected to the inner end portions of the metal lead layer, while the metal lead layer are provided with a lead member at the external end portion or made to serve as terminals as such at the external end portion. Even this embodiment can have similar functions and effects to those of the device of the first embodiment.

In the foregoing, typical embodiments of the present invention have been described. Modifications and variations of these embodiments can be readily made. For example, the cap member may be formed from the same ceramic as that of the insulating substrate. A plurality of the semiconductor elements may be disposed on the insulating substrate. Circuit elements other than the semiconductor elements may be disposed on the insulating substrate together with the semiconductor elements.

A substrate for use according to the second aspect of the present invention will be described in detail below.

As shown in FIG. 1, the present substrate comprises a non-oxide ceramic substrate 1 of, for example, SiC, as a base, a $SiO_2$ layer 2 formed on the surface of the ceramic base as a film capable of reacting with glass, and a glass layer 3 covering the $SiO_2$ layer.

In the second aspect of the present invention, a $SiO_2$ layer 2 having a good adhesion can be formed on the ceramic base 1 by the well known technique, such as by heat oxidation, CVD, or PVD. Furthermore, a glass layer 3 having a coefficient of thermal expansion approximating to that of the base 1 is provided on the $SiO_2$ layer 2 by coating. The glass layer 3 can be bonded to the base 1 with good adhesion through the $SiO_2$ layer, because of good mutual wettability between $SiO_2$ and glass.

Since the SiC-based ceramic base has a coefficient of thermal expansion of $3-4 \times 10^{-6}/°C.$, a glass having a coefficient of thermal expansion of $2-6 \times 10^{-6}/°C.$, preferably $2.5-4.5 \times 10^{-6}/°C.$ can be used for the glass layer 3. The coefficient of thermal expansion of the layer is preferably $2.5-6 \times 10^{-6}/°C.$ to reduce differences in thermal expansion between the glass layer and the base ceramic and between a silicon semiconductor element to be disposed on the glass layer by soldering and the glass layer, giving no residual strain to the glass layer and the silicon semiconductor element provided thereon, and preventing any decrease in their strength.

In the present invention, the thickness of the $SiO_2$ layer formed on the non-oxide ceramic substrate as a thin film capable of reacting with glass is 0.05 μm or more, preferably 0.1–1 μm, more preferably 0.1–0.5 μm in view of the wettability with the glass layer. The thickness of the glass layer is preferably 0.05 mm or less, more preferably 0.05-0.3 mm in view of the thermal conductivity.

The present substrate has a smooth glass layer on the surface, and thus has no bleeding of a conductor paste as applied, and also has a high bonding strength to the conductor paste after baking. The glass layer is susceptible to metal vapor deposition of metal solder or a conductor metal of Cr, Ni, Au, Al, or the like, or to application of an organic binder. The glass layer is also effective for much improving the electrical insulation of the substrate.

Particularly, since a SiC-based ceramic substrate has a coefficient of thermal expansion approximating to that of the silicon semiconductor element, a silicon semiconductor element of larger size can be provided than in the case of the conventional alumina substrate having a high coefficient of thermal expansion. Furthermore, the SiC-based ceramic substrate has a high thermal conductivity and thus is suitable for application in the field requiring a good heat dissipation such as in the semiconductor power modules, integrated circuits in a large scale.

Figure 2:
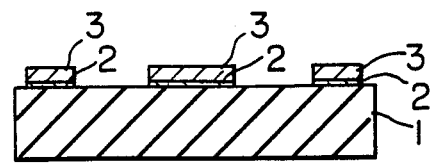
FIG. 2 is a schematic cross-sectional view showing another embodiment of a substrate for a semiconductor device according to the second aspect of the invention.

In FIG. 1, a schematic cross-sectional view of a substrate for a semiconductor device according to the present invention is shown, where a $SiO_2$ layer 2 is provided on the entire surface of a base of SiC-based substrate, and a glass layer 3 is provided on the $SiO_2$ layer. In FIG. 2, a $SiO_2$ layer 2 and a glass layer 3 are locally and partially provided on the surface of the base 1.

EXAMPLE 1

α-form silicon carbide powder having an average particle size of about 2 μm is mixed with 2% by weight of BeO powder as a sintering aid on the basis of the silicon carbide powder, and the mixture is molded and sintered by vacuum hot pressing at 300 kg/cm$^2$ and 2050° C. for 30 minutes. The resulting sintered SiC-based substrate having a relative density of 99% or more is subjected to oxidation treatment at 1200° C. in an oxygen-steam atmosphere to form a hot oxidized layer of $SiO_2$ having a thickness of 0.5 μm. Then, fine powder of borosilicate-based pyrex glass, code No. 7740 of Iwaki Glass Co., Ltd, Japan (composition by weight: 80.9% $SiO_2$, 2.3% $Al_2O_3$, 0.03% $Fe_2O_3$, 12.7% $B_2O_3$, 4.0% $Na_2O$ and 0.04% $K_2O$; coefficient of thermal expansion at room temperature: $3.5 \times 10^{-6}$/°C.) is deposited on the hot-oxidized layer of $SiO_2$ by centrifugal settling, and heated above the softening point of the pyrex glass to form a smooth non-porous glass layer having a glass glaze surface and a thickness of 0.1 mm on the hot oxidized layer of $SiO_2$ on the substrate. The SiC-based substrate has a resistivity of $10^{10}$ Ω.cm or more, a coefficient of thermal expansion of $3.5 \times 10^{-6}$/°C. and a thermal conductivity of 0.7 cal/cm.sec.°C.

Various commercially available conductor pastes mixed with glass frits are applied to the resulting substrates and baked.

Figure 3:
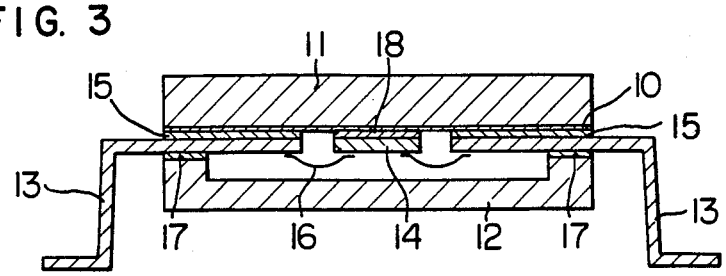
FIG. 3 is a schematic cross-sectional view showing one embodiment of a packaged semiconductor device with a substrate according to the second aspect of the present invention.
Figure 4:
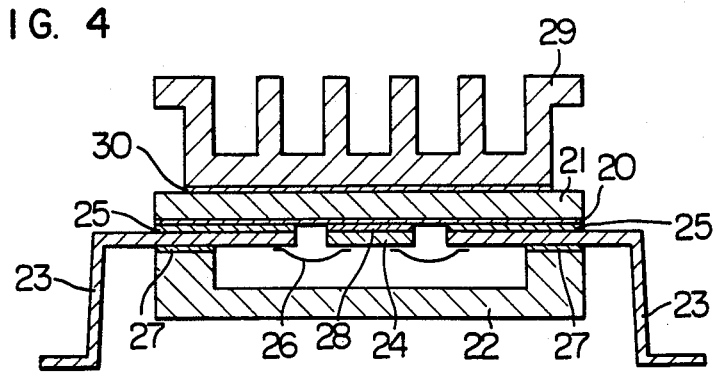
FIG. 4 is a schematic cross-sectional view showing another embodiment of a packaged semiconductor device with a substrate according to the second aspect of the present invention.

As shown in FIGS. 3 or 4, a silicon semiconductor chip 14 or 24, a lead frame 13 or 23 and an alumina ceramic cap 12 or 22 are bonded to a substrate 11 or 21 with a thin $SiO_2$ layer (not indicated in the drawing) through a glass layer 10 or 20 in the following manner.

First of all, an Au-Si eutectic solder is provided on the desired part 18 or 28 for a silicon semiconductor chip on the glass layer 10 or 20 on the SiC-based ceramic substrate 11 or 21 with a thin $SiO_2$ layer and a solder glass No. 2 as given before is provided by prebaking on the edge parts 15 or 25 for the lead frame 13 or 23 on the glass layer 10 or 20 on the substrate 11 or 21. Then, the lead frame 13 or 23 is placed on the prebaked edge parts 15 or 25 and baked, and also the silicon semiconductor chip 14 or 24 is placed on the part 18 or 28 and baked. Then, a wire bondings 16 or 26 are provided between the frame lead 13 or 23 and the silicon semiconductor chip 14 or 24. On the other hand, the solder glass No. 2 is prebaked on the necessary parts 17 or 27 on the alumina ceramic cap 12 or 22 and then the cap 12 or 22 is bonded to the frame lead 13 or 23 by baking. In FIG. 4, a cooling fin 29 is further bonded to the back side of the substrate 21 by the solder glass No. 2.

The bonding strength of the conductor paste and the solder glass layer is measured and is found practically satisfactory.

Sealing part 17 or 27 of $Al_2O_3$ ceramic cap has a helium gas leakage of less than $1 \times 10^{-7}$ cc/sec, and thus is in a good hermetic sealing. The glass layer and the Au-Si joints on the glass layer on the substrate are not damaged by a thermal change at the bonding, and it is found that the substrate has a good strength.

Semiconductor devices with the substrate of the present Example, which have a glass layer provided thereon with a lead frame, a silicon semiconductor chip, and a $Al_2O_3$ ceramic cap through a solder glass or Au-Si eutectic solder, are subjected to an actual load test and a thermal cycle test of cooling and heating and have been found quite satisfactory, and practically applicable.

As described above, the non-oxide ceramic substrate according to the second aspect of the present invention can firmly bond a conductor paste and a glass seal, and can produce good metallizing and glass bonding with good adhesion to the substrate.

The glass layer can not only improve a bonding strength to a conductor paste of a mixture of a metal or metal compound and glass or a sealing glass, but also can act as a buffer for thermal strain produced when there is a large difference in thermal expansion between the conductor paste or sealing glass or solder glass and the non-oxide ceramic substrate, preventing occurrence of cracks in the conductor paste or the sealing glass or the solder glass or peeling of the conductor paste, or the sealing glass or the solder glass.

For example, in the semiconductor device of the first embodiment, as described before, glass sealing of the alumina ceramic cap to the substrate by a sealing glass corresponding to 15 and 17 in FIG. 3 or 20 and 27 in FIG. 4 is preferably carried out at a sealing temperature of 450° C. or less to protect aluminum bonding wires to semiconductor elements from a damage by heating for glass sealing. However, a low melting point glass having a sealing temperature of 450° C. or less generally has a high coefficient of thermal expansion, for example, $6 \times 10^{-7}$/°C. or more, and when a SiC-based ceramic substrate is sealed with such sealing glass, cracks occur in the sealing glass owing to a large difference in thermal expansion therebetween, resulting in gas leakage into the packaged semiconductor device or peeling-off of the sealing glass.

The glass layer on the thin $SiO_2$ layer on the substrate is thus effective for preventing the sealing glass from such troubles as mentioned above. That is, the glass layer to be formed on the $SiO_2$ layer on the non-oxide ceramic base can buffer the thermal strain due to the difference in thermal expansion and helps to provide a crack-free glass seal, when a glass having an intermediate coefficient of thermal expansion between that of the SiC-based ceramic base and that of the sealing glass is selected for the glass layer.

The third aspect of the present invention is to use a substrate comprising a non-oxide ceramic base of, for example, SiC, a $SiO_2$ layer formed on the surface of the ceramic base as a first film capable of reacting with glass and a thick film conduit of a mixture of conductor and glass provided on the $SiO_2$ layer through bonding by reaction as a second layer, where the non-oxide base and the first film are the same as used in the second aspect of the present invention, and the second layer is made of a mixture of conductor and glass most suitable for forming a thick film circuit. The mixture is preferably a paste of a mixture of glass powder and metal powder or metal compound powder in an organic solvent, and is applied to the necessary parts for a circuit on the $SiO_2$ layer of the non-oxide ceramic base. The metal compound can be a conductor or a semiconductor, and can be a compound decomposable to a metal by decomposition at the baking, for example, oxide of Ag or Pd.

The second layer comprises at least one of conductors and resistors, which can be formed by changing a mixing ratio of the glass to the conductor in the paste.

In the present invention, at least the second layer can be further coated with a glass overcoat, which can also react with the first $SiO_2$ layer formed on the non-oxide ceramic substrate to form firm adhesion, and thus the second layer can be thoroughly protected thereby.

According to the present invention, an oxide layer is formed on the surface of an non-oxide ceramic base, for example, SiC-based ceramic base, and then a thick film paste of a mixture of metal or metal compound and glass is applied to the oxide layer by printing, and baked in air or an inert atmosphere, whereby a thick film circuit can be formed on the non-oxide ceramic base. By forming the oxide layer on the surface of the non-oxide ceramic base, such as a SiC-based ceramic base, a thick film circuit with a considerably improved bonding strength can be obtained. This seems due to a difference in the affinity between the non-oxide ceramic base and the oxide layer at the baking of the thick film paste of a mixture of metal or metal compound and glass.

Comparative Example

A thick film paste shown in Table 1 is applied to the same sintered SiC-based ceramic substrate as preparing in Example 1 by printing without forming an oxide layer thereon, and baked. The bonding strength of the baked thick film is 0.30–0.61 kg/mm² and is not satisfactory. The vehicle for the paste is 7% ethylcellulose/carbitol acetate having a viscosity of about 100,000 centipoises. The application of the paste by printing is carried out by masking unwanted parts for paste application with a photoresist, and then applying a paste shown in Table 1, and then by baking the applied paste at 800°–850° C. The resulting thick film has a thickness of 25 μm. The bonding strength is measured by bonding a tensile test piece to the surface of the thick film on the ceramic substrate and then subjecting the bonded substrate to a tensile test.

TABLE 1

| Thick film paste | Proportion of metal powder (wt. %) | | | | Metal-glass ratio (wt. %) | | Glass composition (wt. %) | | | | | | | Bonding strength (kg/mm²) |
|---|---|---|---|---|---|---|---|---|---|---|---|---|---|---|
| | Ag | Pd | Au | Pt | Metal | Glass | $B_2O_3$ | $Bi_2O_3$ | PbO | $SiO_2$ | $Al_2O_3$ | ZnO | CaO | |
| 1 | 70 | 30 | — | — | 80 | 20 | 20 | 40 | 20 | 10 | 2 | 5 | 3 | 0.42 |
| 2 | — | 30 | 70 | — | " | " | " | " | " | " | " | " | " | 0.57 |
| 3 | — | — | 80 | 20 | " | " | " | " | " | " | " | " | " | 0.30 |
| 4 | 70 | 30 | — | — | " | " | 20 | 50 | 10 | 10 | " | " | " | 0.61 |
| 5 | " | " | — | — | 85 | 15 | " | " | " | " | " | " | " | 0.45 |
| 6 | " | " | — | — | 80 | 20 | 30 | 30 | 30 | 10 | " | " | " | 0.38 |
| 7 | 80 | 20 | — | — | 85 | 15 | 10 | 10 | 40 | 30 | 3 | 3 | 4 | 0.52 |
| 8 | " | " | — | — | " | " | 10 | 5 | 60 | 20 | 2 | 3 | — | 0.43 |
| 9 | " | " | — | — | 90 | 10 | " | " | " | " | " | " | — | 0.39 |
| 10 | " | " | — | — | 85 | 15 | 20 | 20 | 40 | 15 | 3 | 2 | — | 0.48 |

EXAMPLE 2

Figure 5:
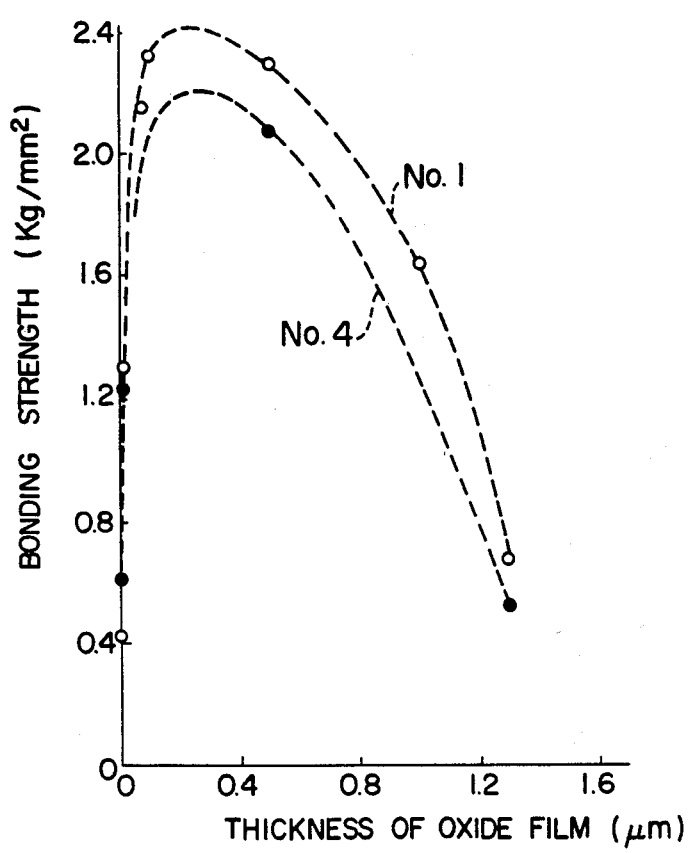
FIG. 5 is a diagram showing relations between the thickness of an oxide layer and the bonding strength.

The same sintered SiC-based ceramic substrate, as prepared in Example 1, is subjected to oxidation treatment at 1,300° C. in air for a varied oxidation time to form an oxide film, and then a conductor paste shown in Table 1 is applied to the oxide film by printing in the same manner as in Comparative Example to form a thick film thereof. The bonding strength of the thick film is shown in Table 2, and can be considerably improved, as shown in FIG. 5. Particularly when the thickness of an oxide film is 0.1–0.5 μm, the bonding strength is 2 kg/mm² or higher, and thus practically large enough.

When the thickness of an oxide film is less than 0.01 μm or more than 1 μm, the bonding strength is slightly lowered. This seems due to a higher possibility for cracking in the oxide film on the SiC-based ceramic substrate when the thickness is more than 1 μm. The procedure for forming an oxide film is not limited to the one disclosed in the present example.

The procedure for forming a thick film and testing the bonding strength are the same as disclosed in Comparative Example.

Figure 6:
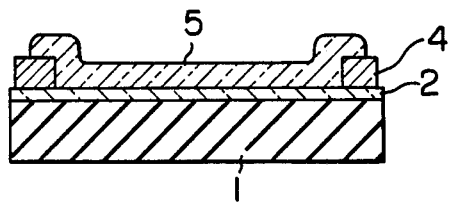
FIG. 6 is a schematic cross-sectional view showing one embodiment of a substrate with a conductor and a resistor according to the third aspect of the present invention.

FIG. 6 is a schematic cross-sectional view showing a SiC-based ceramic substrate 1 with a SiO layer 2 having a thickness of 0.10 μm, and a conductor 4 provided partly on the $SiO_2$ layer and prepared from the thick film paste No. 1 shown in Table 1 and a resistor 5 provided on the conductor and the exposed $SiO_2$ layer and prepared from a thick film paste consisting of 8.2% by weight of Ag and 18.8% by weight of Pb, the balance being the glass of the thick film paste No. 1 shown in Table 1 to a thickness of about 20 to about 25 μm.

TABLE 2

| Thick film paste No. (corresponding to Table 1) | Oxidation time (min.) | Oxide film thickness (μm) | Bonding strength (kg/mm²) |
|---|---|---|---|
| 1 | 0 | 0.008 | 0.42 |
| 1 | 1 | 0.01 | 1.30 |
| 1 | 5 | 0.07 | 2.16 |
| 1 | 8 | 0.10 | 2.32 |
| 1 | 60 | 0.50 | 2.29 |
| 1 | 200 | 1.00 | 1.64 |

TABLE 2-continued

| Thick film paste No. (corresponding to Table 1) | Oxidation time (min.) | Oxide film thickness (μm) | Bonding strength (kg/mm²) |
| --- | --- | --- | --- |
| 1 | 400 | 1.30 | 0.69 |
| 4 | 1 | 0.01 | 1.23 |
| 4 | 60 | 0.50 | 2.08 |
| 4 | 400 | 1.30 | 0.52 |
| 7 | 60 | 0.50 | 2.48 |
| 9 | 60 | " | 2.12 |
| 3 | 60 | " | 2.34 |

EXAMPLE 3

A glass overcoat paste comprising 10% by weight of PbO, 20% by weight of $SiO_2$, 10% by weight of $Al_2O_3$, 20% by weight of CdO, and 40% by weight of $B_2O_3$ is applied to the wanted parts on the surface of the same substrate having a 0.10 μm-thick oxide layer and the thick film conductor and resistor based on the thick film paste No. 1 and baked thereon as prepared in Example 2, and heated at 700° C. for 10 minutes. The unovercoated parts are destined for conductor terminals, condensers, etc.

Figure 7:
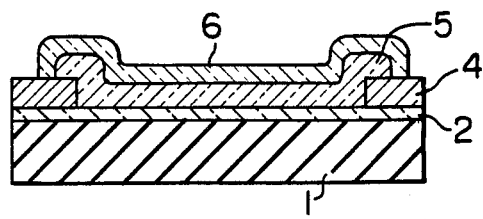
FIG. 7 is a schematic cross-sectional view showing another embodiment of the substrate shown in FIG. 6 with an additional glass overcoat according to the third aspect of the present invention.

FIG. 7 shows a schematic cross-sectional view of the substrate having a glass overcoat 6 on the thick film circuit of conductor 4 and resistor 5 on the $SiO_2$ layer 2 on the substrate 1 shown in FIG. 6.

As described above, a non-oxide ceramic substrate having a thick film circuit with a high bonding strength can be obtained in the present invention.

What is claimed is:

1. A semiconductor device, comprising:
   an insulating substrate comprising non-oxide ceramic as the main component and having a coefficient of thermal expansion approximating to that of a semiconductor material and a thermal conductivity not smaller than 0.2 cal/sec.cm.° C. at room temperature, an oxide layer having sufficient thickness to provide a good bonding strength provided on the substrate and a glass layer provided on the oxide layer;
   at least one semiconductor element disposed at a predetermined location on one surface of the insulating substrate;
   a cap member of ceramic bonded to be a preselected portion on the one surface of the insulating substrate, thereby forming a package hermetically enclosing the semiconductor element together with the insulating substrate; and
   a terminal means whose one end is electrically connected to the semiconductor element within the package and whose other end is exposed at the outside of the package.

2. A semiconductor device, comprising:
   an insulating substrate comprising non-oxide ceramic as the main component containing 0.05 to 5% by weight of at least one of Be and a compound of Be in terms of Be element on the basis of total ceramic and having a relative density of not lower than 90% to the theoretical density, an oxide layer having sufficient thickness to provide a good bonding strength provided on the substrate and a glass layer provided on the oxide layer;
   at least one semiconductor element disposed at a predetermined location on one surface of the insulating substrate;
   a cap member of ceramic bonded to a preselected portion on the one surface of the insulating substrate, thereby forming a package hermetically enclosing the semiconductor element together with the insulating substrate; and
   a thermal means whose one end is electrically connected to the semiconductor element within said package and whose other end is exposed at the outside of the package.

3. The semiconductor device according to claim 2, wherein a cooling fin is mounted on the other surface of the insulating substrate.

4. The semiconductor device according to claim 2, wherein a cooling fin is formed at the other surface of the insulating substrate integrally with the insulating substrate, the cooling fin being made of the same material as that of the insulating substrate.

5. The semiconductor device according to claim 2, wherein the non-oxide as a main component ceramic for the insulating substrate is at least one of SiC, $Si_3N_4$ and AlN.

6. The semiconductor device according to claim 5, wherein a cooling fin is mounted on the other surface of the insulating substrate.

7. The semiconductor device according to claim 5, wherein a cooling fin is formed at the other surface of the insulating substrate integrally with the insulating substrate, the cooling fin being made of the same material as that of the insulating substrate.

8. A semiconductor device, comprising:
   an insulating substrate comprising SiC ceramic, containing 0.05 to 5% by weight of at least one of Be and a compound of Be in terms of Be element on the basis of total ceramic and having a relative density of not lower than 90% to the theoretical density, an oxide layer having sufficient thickness to provide a good bonding strength provided on the substrate and a glass layer provided on the oxide layer;
   at least one semiconductor element disposed at a predetermined location on one surface of said insulating substrate;
   a cap member of ceramic bonded to a preselected portion on the one surface of the insulating substrate, thereby forming a package hermetically enclosing the semiconductor element together with the insulating substrate; and
   a terminal means whose one end is electrically connected to the semiconductor element within the package and whose other end is exposed at the outside of said package.

9. The semiconductor device according to any one of claims 1 to 8, wherein the cap member is bonded to the insulating substrate by a low melting point glass.

10. The semiconductor device according to claim 9, wherein the low melting point glass has a coefficient of thermal expansion of $5-10 \times 10^{-6}/°$ C. at room temperature and a composition of $PbO-ZnO-B_2O_3$ as the main components.

11. The semiconductor device according to claim 10, wherein the low melting point glass comprises 60–75% by weight of PbO, 5–20% by weight of ZnO, 5–20% by weight of $B_2O_3$, not more than 15% by weight of $SiO_2$ and not more than 5% by weight of $Al_2O_3$.

12. The semiconductor device according to claim 1, 2 or 8, wherein the oxide layer is obtained by oxidation treatment of said substrate.

13. The semiconductor device according to claim 12, wherein the glass layer has a coefficient of thermal expansion of $2.5-6 \times 10^{-6}/°$ C. at room temperature, and contains $SiO_2$ as the main component and further contains 5–20% by weight of $B_2O_3$, not more than 10% by weight of $Na_2O$ and not more than 5% by weight of $Al_2O_3$.

14. The semiconductor device according to claim 1, 2 or 8, wherein the insulating substrate comprises a non-oxide sintered ceramic, an oxide layer and a thick film circuit of a mixture of conductor and glass bonded with the oxide layer be reaction therewith as a second layer.

15. The semiconductor device according to claim 14, wherein the oxide layer is a layer obtained by oxidation treatment of said substrate.

16. The semiconductor device accoding to claim 14 or 15, wherein the second layer is at least one of conductors and resistors.

17. The semiconductor device according to claim 14, wherein the second layer is coated with a glass overcoat.

18. A semiconductor device according to claim 1, wherein said oxide layer is $SiO_2$ and the non-oxide ceramic is SiC or $Si_3N_3$.

19. A semiconductor device according to claim 1, wherein said oxide layer is $Al_2O_3$ and the non-oxide ceramic is AlN.

20. A semiconductor device according to claim 2, wherein said oxide layer is $SiO_2$ and the non-oxide ceramic is SiC or $Si_3N_3$.

21. A semiconductor device according to claim 2, wherein said oxide layer is $Al_2O_3$ and the non-oxide ceramic is AlN.

22. A semiconductor device according to claim 8, wherein said oxide layer comprises $SiO_2$ formed by oxidation treatment of said substrate.

23. A semiconductor device according to claim 1, 2 or 8, wherein the oxide layer has a thickness of from 0.1 to 1.0 $\mu$m and the glass layer has a thickness of not more than 0.05 mm.

* * * * *